United States Patent
Kobayashi

(10) Patent No.: US 9,318,301 B2
(45) Date of Patent: *Apr. 19, 2016

(54) SAMPLE INTRODUCTION DEVICE AND CHARGED PARTICLE BEAM INSTRUMENT

(71) Applicant: JEOL Ltd., Tokyo (JP)

(72) Inventor: Masaaki Kobayashi, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/554,469

(22) Filed: Nov. 26, 2014

(65) Prior Publication Data

US 2015/0206703 A1    Jul. 23, 2015

(30) Foreign Application Priority Data

Nov. 26, 2013  (JP) ................................. 2013-243914

(51) Int. Cl.
*H01J 37/18* (2006.01)
*H01J 37/26* (2006.01)
*H01J 37/20* (2006.01)

(52) U.S. Cl.
CPC ............... *H01J 37/185* (2013.01); *H01J 37/26* (2013.01); *H01J 2237/184* (2013.01); *H01J 2237/20285* (2013.01)

(58) Field of Classification Search
USPC ............... 250/440.11, 441.11, 442.11, 443.1, 250/306, 307, 309, 310, 311
See application file for complete search history.

(56) References Cited

U.S. PATENT DOCUMENTS

| 2011/0180724 | A1* | 7/2011 | Terada et al. ............ 250/442.11 |
| 2012/0212583 | A1* | 8/2012 | Yaguchi ............. G01N 23/2204 348/46 |
| 2014/0290393 | A1* | 10/2014 | Yuasa ........................ 73/864.83 |

FOREIGN PATENT DOCUMENTS

JP          8293278 A      11/1996

* cited by examiner

*Primary Examiner* — Nicole Ippolito
(74) *Attorney, Agent, or Firm* — The Webb Law Firm

(57) ABSTRACT

A sample introduction device (100) has a pre-evacuation chamber (2), a sample holder (10), a mechanical drive arrangement (30) for moving the sample holder (10), and a controller (90). The controller (90) performs a first operation for controlling the mechanical drive arrangement (30) to move a support member (20) such that this support member (20) supports the sample holder (10) when its sample holding portion (12) is in the pre-evacuation chamber (2) and to bring the support member (20) to a halt, a second operation for making a decision as to whether the sample holding portion (12) can be moved into the sample chamber (1), based on the position at which the support member (20) is halted, and a third operation for moving the support member (20) supporting the sample holder (10) such that the sample holding portion (12) moves from the pre-evacuation chamber (2) into the sample chamber (1) if the decision is affirmative to indicate that the sample holding portion (12) can be moved into the sample chamber (1).

10 Claims, 11 Drawing Sheets

SAMPLE INTRODUCTION DEVICE AND CHARGED PARTICLE BEAM INSTRUMENT

BACKGROUND OF THE INVENTION

1. Field of the Invention

The present invention relates to a sample introduction device and charged particle beam instrument.

2. Description of Related Art

In a charged particle beam instrument such as a transmission electron microscope, a sample to be observed or analyzed is generally held by a sample holder. The sample held by the sample holder is introduced into the sample holder of the transmission electron microscope by inserting the sample holder into the sample chamber (see, for example, JP-A-8-293278).

The interior of the sample chamber of the transmission electron microscope is in a vacuum state. Therefore, when a sample holder is inserted into the sample chamber, a force urging the sample holder into the sample chamber is applied to the sample holder due to the pressure difference between the sample chamber and the outside. The force drawing the holder into the chamber is applied to the sample holder and thus the holder is jerked into the sample chamber. This creates the danger that the sample held in the holder will be damaged or the degree of vacuum in the sample chamber will deteriorate. Accordingly, the user must insert the sample holder into the sample chamber while supporting the holder so as to prevent the holder from being pulled into the sample chamber violently.

SUMMARY OF THE INVENTION

The present invention has been made in view of the foregoing problems. One object associated with some aspects of the present invention is to provide a sample introduction device permitting a sample to be introduced into a sample chamber easily. Another object associated with some aspects of the invention is to offer a charged particle beam instrument including this sample introduction device.

(1) A sample introduction device associated with the present invention is adapted to introduce a sample into a sample chamber of a charged particle beam instrument and has: a pre-evacuation chamber for performing pre-evacuation; a sample holder having a sample holding portion capable of holding the sample; a mechanical drive arrangement for moving the sample holder; and a controller for controlling the mechanical drive arrangement. The controller performs a first operation for controlling the mechanical drive arrangement to move a support member such that the support member provides support of the sample holder when the sample holding portion is in the pre-evacuation chamber and to bring the support member to a halt, a second operation for making a decision as to whether the sample holding portion can be moved into the sample chamber, based on the position at which the support member is halted, and a third operation for controlling the mechanical drive arrangement to move the support member providing support of the sample holder such that the sample holding portion moves from the pre-evacuation chamber into the sample chamber if the decision is affirmative to indicate that the sample holding portion can be moved into the sample chamber.

In this sample introduction device, it is possible to prevent a sample holder of an inappropriate length from being introduced into the sample chamber; otherwise, components (such as a goniometer and the polepieces of an objective lens) of the charged particle beam instrument would be destroyed or damaged.

Furthermore, this sample introduction device is configured including a mechanical drive arrangement for moving the support member providing support of the sample holder such that the sample holding portion is moved from the pre-evacuation chamber into the sample chamber. Consequently, the sample can be easily introduced into the sample chamber.

(2) In one feature of this sample introduction device, the controller may determine that, if the support member is halted in a given position during the first operation, the sample holding portion can be moved into the sample chamber. The controller can determine that, if the support member is not halted in the given position during the first operation, the sample holding portion cannot be moved into the sample chamber.

In this sample introduction device, it is possible to prevent a sample holder of an inappropriate length from being introduced into the sample chamber.

(3) In another feature of this sample introduction device, the sample holder may have at least one cutout. The support member may have a fitting portion that is fitted into the cutout when the support member provides support of the sample holder.

In this sample introduction device, if a sample holder not having such a cutout is used, the support member provides support of the sample holder at a position different from the given position. This can prevent an inappropriate sample holder not having the cutout from being introduced into the sample chamber erroneously.

(4) In a further feature of this sample introduction device, the at least one cutout of the sample holder may be two in number, and the two cutouts may be arranged symmetrically with respect to the axis of the sample holder.

In this sample introduction device, the support member allows for balanced support of the sample holder.

(5) In a still other feature of this sample introduction device, the mechanical drive arrangement may have air cylinders connected to the support member. The controller may bring the support member to a halt in response to the pressure inside the air cylinders during the first operation.

In this sample introduction device, the sample holder can be supported by the support member under control of the controller.

(6) In an additional feature of this sample introduction device, the mechanical drive arrangement may have air cylinders connected to the support member. The controller may bring the support member to a halt in response to the flow rate of gas in the air cylinders during the first operation.

In this sample introduction device, the sample holder can be supported by the support member under control of the controller.

(7) In a still further feature of this sample introduction device, the mechanical drive arrangement may apply a second force, which is opposite in sense to a first force applied to the sample holder by the pressure difference between the sample chamber and the outside and is smaller than the first force, to the sample holder during the third operation.

In this sample introduction device, it is possible to prevent the sample holder from being drawn into the sample chamber violently due to the first force applied to the sample holder by the pressure difference between the sample chamber and the outside (atmospheric pressure).

(8) In an additional feature of this sample introduction device, there may be further provided: a goniometer for rotating the sample holder; and a partition valve for isolating the pre-evacuation chamber and the sample chamber from each other. The controller may further operate to rotate the goniometer to open the partition valve.

With this sample introduction device, a sample can be easily introduced into the sample chamber.

(9) In a yet other feature of this sample introduction device, the mechanical drive arrangement may move the sample holder such that the sample holding portion moves from the sample chamber into the pre-evacuation chamber.

With this sample introduction device, a sample can be easily moved from the sample chamber into the pre-evacuation chamber. Therefore, the sample can be easily taken out of the sample chamber.

(10) A charged particle beam instrument associated with the present invention includes a sample introduction device associated with the present invention.

Since this charged particle beam instrument includes the sample introduction device associated with the present invention, the sample can be easily introduced into the sample chamber.

DESCRIPTION OF THE INVENTION

The preferred embodiments of the present invention are hereinafter described in detail with reference to the drawings. It is to be understood that the embodiments provided below do not unduly restrict the scope of the present invention delineated by the appended claims and that not all the configurations described below are essential constituent components of the invention.

1. Configuration of Charged Particle Beam Instrument

Figure 1:
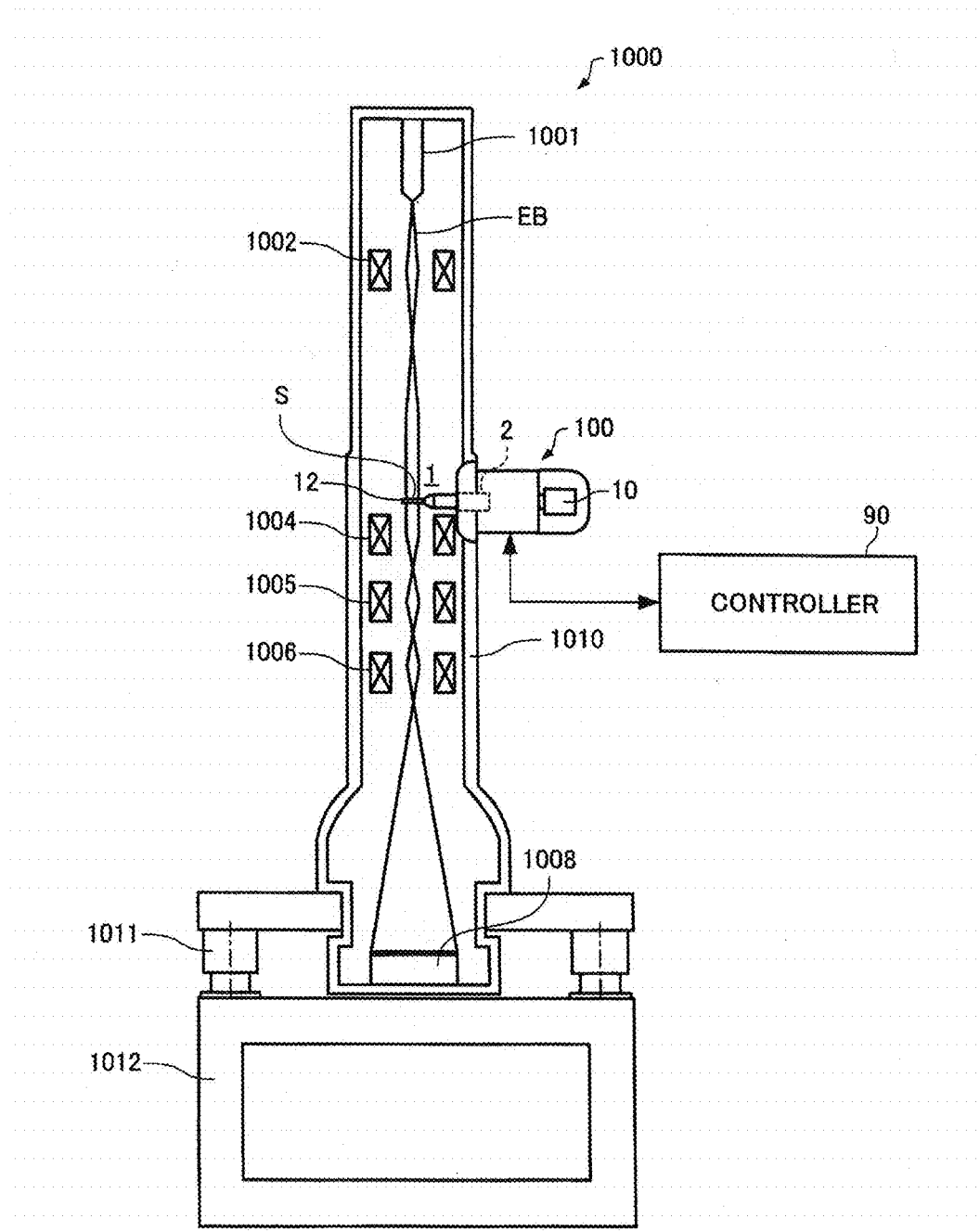
FIG. 1 is a vertical cross section, party in block form, of a charged particle beam instrument associated with one embodiment of the present invention.

The configuration of a charged particle beam instrument associated with one embodiment of the present invention is first described by referring to FIG. 1, which schematically shows the charged particle beam instrument, 1000.

It is now assumed that the charged particle beam instrument 1000 associated with the present embodiment includes a sample introduction device, 100, associated with the present invention. In FIG. 1, the sample introduction device 100 is shown schematically.

As shown in FIG. 1, the charged particle beam instrument 1000 is configured including an electron beam source 1001, a condenser lens or a system of condenser lenses 1002, the sample introduction device 100, an objective lens 1004, an intermediate lens 1005, a projector lens 1006, an imaging device 1008, and an electron optical column 1010. In this example, the charged particle beam instrument 1000 is a transmission electron microscope (TEM). In the state shown in FIG. 1, a sample holder 10 has been inserted in a sample chamber 1, i.e., a sample holding portion 12 and a sample S are in the sample chamber 1.

The electron beam source 1001 that is a charged particle beam source emits an electron beam EB by accelerating electrons, released from a cathode, by means of anodes. A well-known electron gun can be used as the electron beam source 1001. No restriction is imposed on the electron beam source 1001. For example, a thermionic electron gun, a thermal field-emission electron gun, a cold field emission electron gun, or the like can be used.

The condenser lenses 1002 are arranged behind the electron beam source 1001. The electron beam EB generated by the electron beam source 1001 is focused onto the sample S by the condenser lenses 1002.

The sample S is held in the sample chamber 1 by the sample holder 10. The sample chamber 1 is a space inside the electron optical column 1010. The sample chamber 1 is maintained at vacuum or subatmospheric pressure. In the sample chamber 1, the sample S is irradiated with the electron beam EB.

The sample introduction device 100 is used to introduce the sample S into the sample chamber 1. The sample introduction device 100 can move the sample holding portion 12 holding the sample S from a pre-evacuation chamber 2 into the sample chamber 1 and vice versa by moving the sample holder 10.

The sample introduction device 100 acts also as a sample stage which holds the sample S in the sample chamber 1 and which places the sample S in position in the sample chamber 1. In the illustrated example, the sample introduction device 100 constitutes a side-entry stage that inserts the sample holder 10 (sample S) from a side of the objective lens 1004. Details of the sample introduction device 100 will be described later.

The objective lens 1004 is disposed behind the condenser lenses 1002. The objective lens 1004 is an initial stage of lens for focusing the electron beam EB transmitted through the sample S.

The objective lens 1004 has a top polepiece and a bottom polepiece (none of which are shown). The objective lens 1004 produces a magnetic field between the top and bottom polepieces to bring the electron beam EB into focus. The top and bottom polepieces are disposed on opposite sides of the sample holding portion 12. That is, the sample S is placed between the top and bottom polepieces. The sample chamber 1 includes the space between the top and bottom polepieces.

The intermediate lens 1005 is located behind the objective lens 1004. The projector lens 1006 is located behind the intermediate lens 1005. The intermediate lens 1005 and projector lens 1006 cooperate to further magnify the image focused by the objective lens 1004 and to focus the magnified image onto the imaging device 1008.

The imaging device 1008 captures the image (electron microscope image or electron diffraction pattern) focused by the projector lens 1006. For example, the imaging device 1008 is a digital camera and outputs information about the captured electron microscope image or electron diffraction pattern. This information is then processed by an image processor (not shown) and displayed on a display device (not shown). The display device is a CRT, LCD, touch panel display, or the like, for example.

In the illustrated example, the charged particle beam instrument 1000 is mounted over a pedestal 1012 via vibration isolators 1011.

Figure 2:
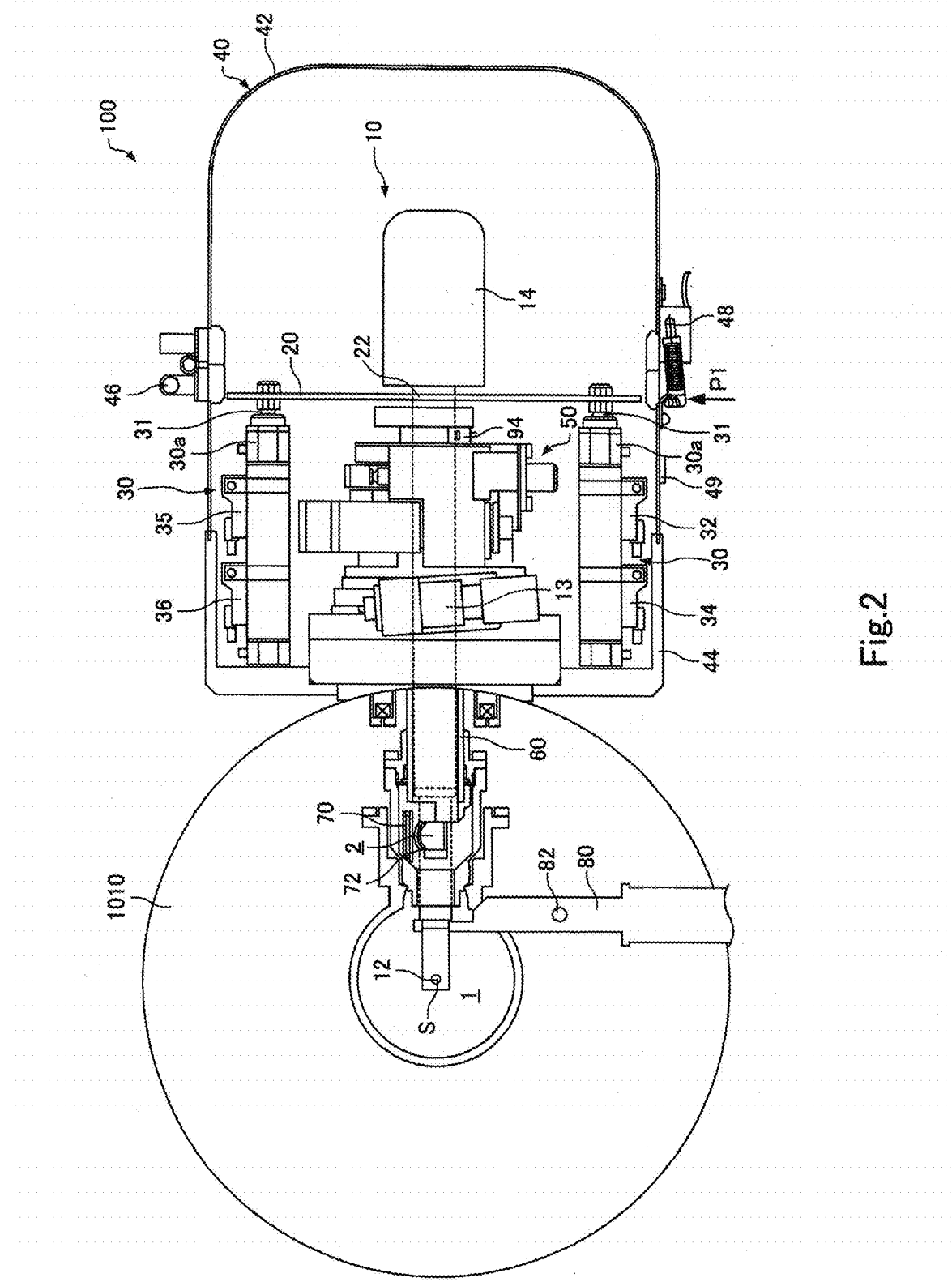
FIG. 2 is a plan view of the sample introduction device shown in FIG. 1 and built in accordance with the invention.

FIG. 2 schematically shows the sample introduction device 100, as viewed from above the device 100 (i.e., along the direction of travel of the electron beam EB). In the state shown in FIG. 2, the sample holder 10 has been inserted in the sample chamber 1.

As shown in FIG. 2, the sample introduction device 100 is configured including the pre-evacuation chamber 2, the sample holder 10, a support member 20, a mechanical drive arrangement 30, a gonio cover 40, a goniometer 50, a sample holder insertion tube 60, a partition valve 70, a lever 80, and a controller 90 (see FIG. 1).

The pre-evacuation chamber 2 is a space for performing pre-evacuation to permit the sample holder 10 to be guided into the sample chamber 1. That is, when the sample S is introduced into the sample chamber 1, the interior of the pre-evacuation chamber 2 is evacuated to a given pressure. By performing pre-evacuation, the sample S can be introduced into the sample chamber 1 while suppressing decreases in the degree of vacuum in the sample chamber 1.

The pre-evacuation chamber 2 can be evacuated from atmospheric pressure to the given pressure. For example, the pre-evacuation chamber 2 is connected to vacuum pumping equipment via a vacuum valve (not shown). The pre-evacuation chamber 2 is evacuated by opening this valve. Pre-evacuation is started, for example, when a user depresses a sample holder exchange switch 49 mounted on the gonio cover 40.

The pre-evacuation chamber 2 is a space inside the sample holder insertion tube 60. The pre-evacuation chamber 2 and the sample chamber 1 are in communication with each other via the partition valve 70. The pre-evacuation chamber 2 is placed into communication with the sample chamber 1 by opening the partition valve 70, which is a vacuum partition used to isolate the sample chamber 1 and the pre-evacuation chamber 2 from each other. The partition valve 70 is firmly secured to a gear 72, which in turn is held to the goniometer 50. The gear 72 is rotated by rotating the sample holder insertion tube 60. As a result, the partition valve 70 is opened or closed.

Figure 3:
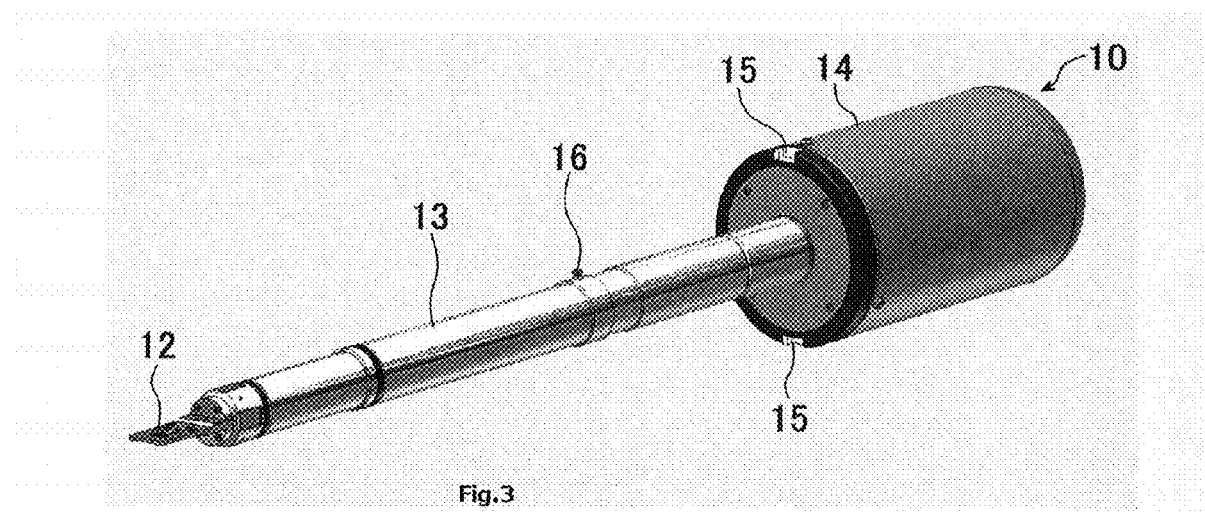
FIG. 3 is a schematic perspective view of the sample holder of the sample introduction device shown in FIG. 2.

FIG. 3 is a schematic perspective view of the sample holder 10.

The sample holder 10 is a rod-like member and includes the sample holding portion 12, a shaft 13, and a grip 14.

The sample holding portion 12 is formed at one longitudinal end of the shaft 13. The grip 14 is formed at the other longitudinal end of the shaft 13. The sample holding portion 12 can hold the sample S. The sample S may be secured to the sample holding portion 12 by tightening a screw (not shown). Alternatively, the sample S may be pressed against and secured to the sample holding portion by a spring. The grip 14 is designed to be grasped and held by a user in holding the sample holder 10. The grip 14 is greater in diameter than the shaft 13.

As shown in FIG. 3, the grip 14 has cutouts 15 formed in the surface of the grip 14 closer to the shaft 13. The support member 20 has fitting portions 24 that are fitted in the cutouts 15. Thus, the sample holder 10 is supported by the support member 20.

In the illustrated example, the cutouts 15 are two in number. The two cutouts 15 are arranged symmetrically with respect to the axis of the sample holder 10. That is, the two cutouts 15 are disposed on a straight line perpendicular to the axis of the sample holder 10. The cutouts 15 are equidistant from this axis.

The cutouts 15 are so formed that, when the sample holder 10 is supported by the support member 20, the fitting portions 24 of the support member 20 can be fitted in the cutouts 15. The cutouts 15 are parts of the sample holder 10 which make contact with the support member 20. The surface constituting the cutouts 15 touches the surface constituting the fitting portions 24. Thus, the sample holder 10 is supported by the support member 20.

In the illustrated example, there are two cutouts 15. No restriction is imposed on the number of the cutouts 15. The number may be one. Alternatively, the number may be 3 or more.

In the example of FIG. 2, a force urging the sample holder 10 into the sample chamber 1 acts on the sample holder 10 by the pressure difference between the interior of the sample chamber 1 and the outside (atmospheric pressure). The holder 10 is pressed against the lever 80 by this force. The lever 80 is a mechanical lever pivotable about a shaft 82. The lever 80 can be actuated, for example, by operating an electric motor (not shown). The sample holder 10 can be moved along the axis of the sample holder 10 by the lever 80.

The support member 20 can support the sample holder 10. The support member 20 is a plate-like member provided with a through-hole 22 through which the sample holding portion 12 and shaft 13 of the sample holder 10 pass. The support member 20 is connected with the mechanical drive arrangement 30. The mechanical drive arrangement 30 has rods 31 to which the support member 20 is held. As the rods 31 make a linear motion, the support member 20 moves linearly. In the example of FIG. 2, the support member 20 is in its initial position P1. The support member 20 can move from its initial position P1 to position P2 (FIG. 8), position P3 (FIG. 10), and position P4 (FIG. 9) owing to linear motion of the rods 31. Consequently, the sample holding portion 12 (sample S) can be moved from the pre-evacuation chamber 2 into the sample chamber 1 and vice versa.

Figure 4:
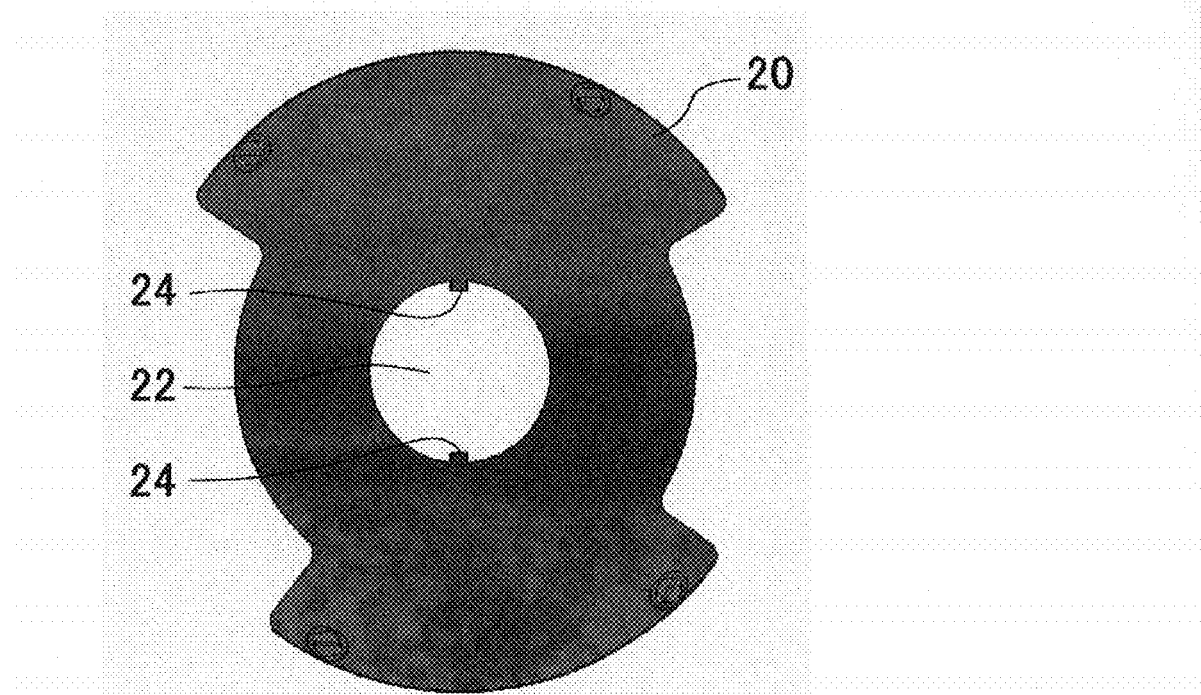
FIG. 4 is a schematic plan view of a support member of the sample introduction device shown in FIGS. 2 and 3.

FIG. 4 is a schematic plan view of the support member 20.

As shown in FIG. 4, the support member 20 has the fitting portions 24. The fitting portions 24 are so formed that, when the support member 20 supports the sample holder 10, the fitting portions 24 are fitted in the cutouts 15 of the sample holder 10. The fitting portions 24 are equal in number with the cutouts 15 in the sample holder 10. In the illustrated example, two fitting portions 24 are formed in conformity with the two cutouts 15. The fitting portions 24 are arranged symmetrically with respect to the center of the through-hole 22. For example, the fitting portions 24 are protruding parts of the surface of the support member 20 defining the through-hole 22.

The mechanical drive arrangement 30 moves the support member 20, thus moving the sample holder 10 supported to the support member 20. In the present embodiment, the mechanical drive arrangement 30 includes air cylinders 30*a* and a compressed air supply unit (not shown) for supplying compressed air into the air cylinders 30*a*. For example, each air cylinder 30*a* is a mechanical element for converting the energy of the compressed air into a linear motion. The air cylinders 30*a* have the respective rods 31 to which the support member 20 is connected. When each air cylinder 30*a* expands and contracts, the rod 31 moves linearly to thereby move the support member 20.

Figure 5:
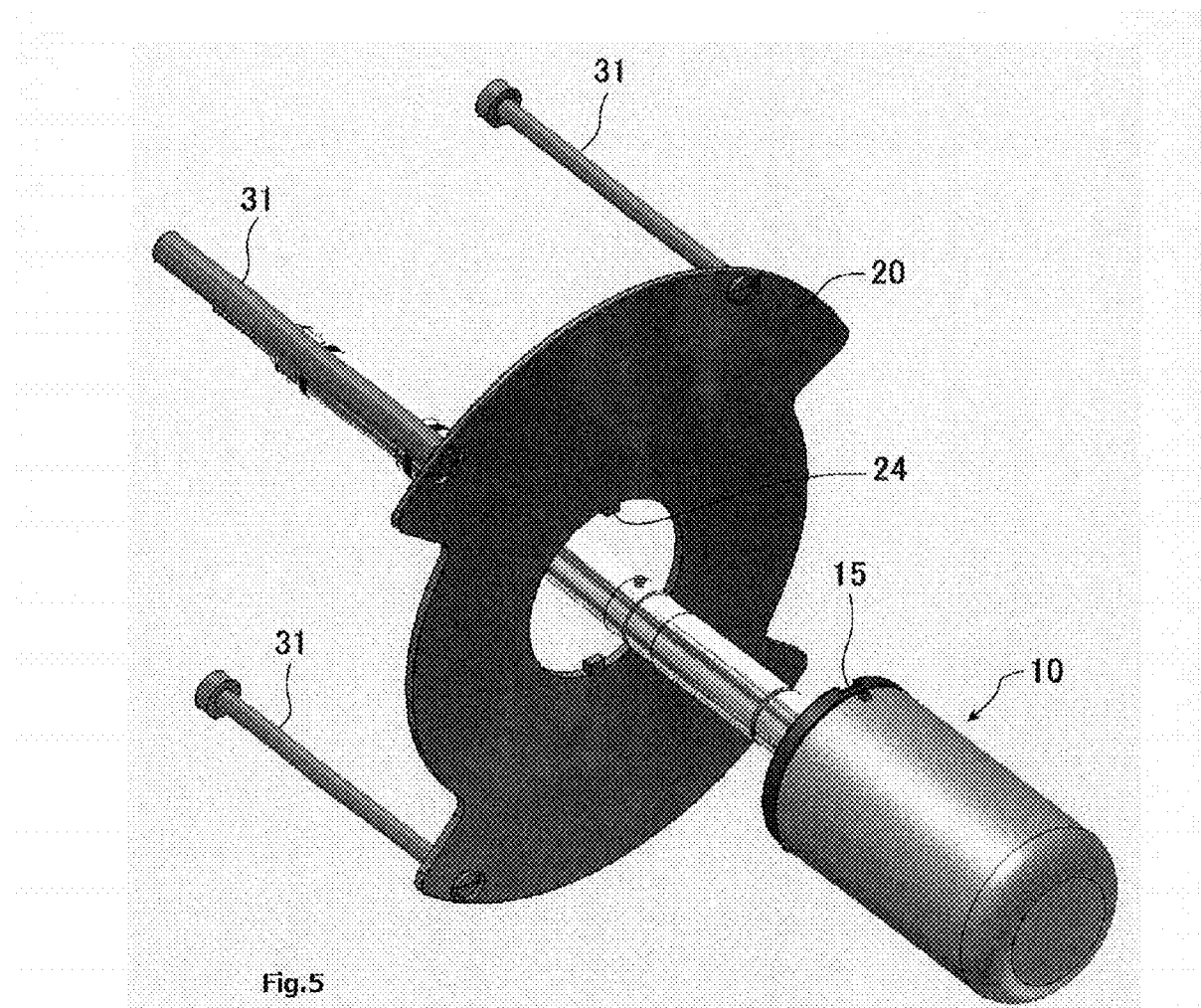
FIG. 5 is a schematic perspective view of the support member, rods, and the sample holder of the sample introduction device shown in FIGS. 2 and 3.

FIG. 5 is a schematic perspective view of the support member 20, rods 31, and sample holder 10 under the condition where the sample holder 10 has been inserted in the pre-evacuation chamber 2.

The sample introduction device 100 has four air cylinders 30a. As shown in FIG. 5, the rods 31 of the four air cylinders 30a are connected to the support member 20.

Figure 6:
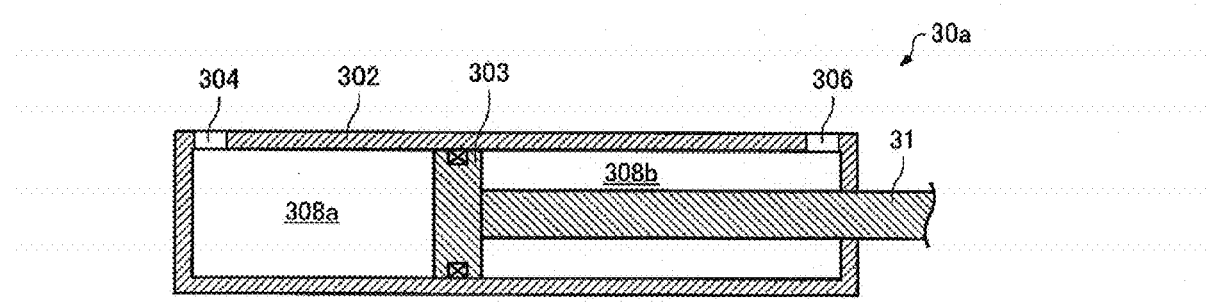
FIG. 6 is a schematic cross section of one air cylinder of the sample introduction device shown in FIG. 2.

FIG. 6 is a schematic cross section of one air cylinder 30a. This air cylinder 30a is configured including a respective one of the rods 31, a cylinder tube 302, a piston 303, a first port 304, and a second port 306.

In this air cylinder 30a, the piston 303 mounted at one end of the rod 31 partitions the interior of the cylinder tube 302 into a first pressure chamber 308a and a second pressure chamber 308b. In the first pressure chamber 308a, compressed air is supplied and discharged through the first port 304. In the second pressure chamber 308b, compressed air is supplied and discharged through the second port 306.

In the air cylinder 30a, if compressed air fed in from the compressed air supply unit is supplied from the first port 304 into the first pressure chamber 308a, the pressure in the first pressure chamber 308a increases, stretching the rod 31. On the other hand, if compressed air fed in from the compressed air supply unit is supplied from the second port 306 into the second pressure chamber 308b, the pressure in the second pressure chamber 308b increases, contracting the rod 31.

The compressed air supply unit supplying air to the mechanical drive arrangement 30 has pressure gauges for measuring the pressure in the first pressure chamber 308a and the pressure in the second pressure chamber 308b. The controller 90 (described later) obtains information about the pressures in the first pressure chamber 308a and second pressure chamber 308b from the pressure readings of the pressure gauges.

When the rod 31 is stretched and the support member 20 is moved, if the support member 20 comes into contact with the sample holder 10 and the holder 10 becomes supported by the support member 20, the pressure inside the first pressure chamber 308a rises. Therefore, in the operation for moving the support member 20 so as to support the sample holder 10, if the pressure inside the first pressure chamber 308a exceeds a given pressure, the controller 90 halts motion of the support member 20 on the assumption that the support member 20 provides support of the sample holder 10 as described later.

The mechanical drive arrangement 30 moves the support member 20 such that the sample holding portion 12 moves from the pre-evacuation chamber 2 into the sample chamber 1. At this time, the mechanical drive arrangement 30 applies a force F2, which is opposite in sense to a force F1 applied to the sample holder 10 by the pressure difference between the sample chamber 1 and the outside (atmospheric pressure) and is smaller than the force F1, to the sample holder 10 (see FIG. 10). This can prevent the sample holder 10 from being drawn into the sample chamber 1 violently. The sample holding portion 12 can be moved from the pre-evacuation chamber 2 into the sample chamber 1 by moving the sample holder 10 at a desired speed.

Figure 11:
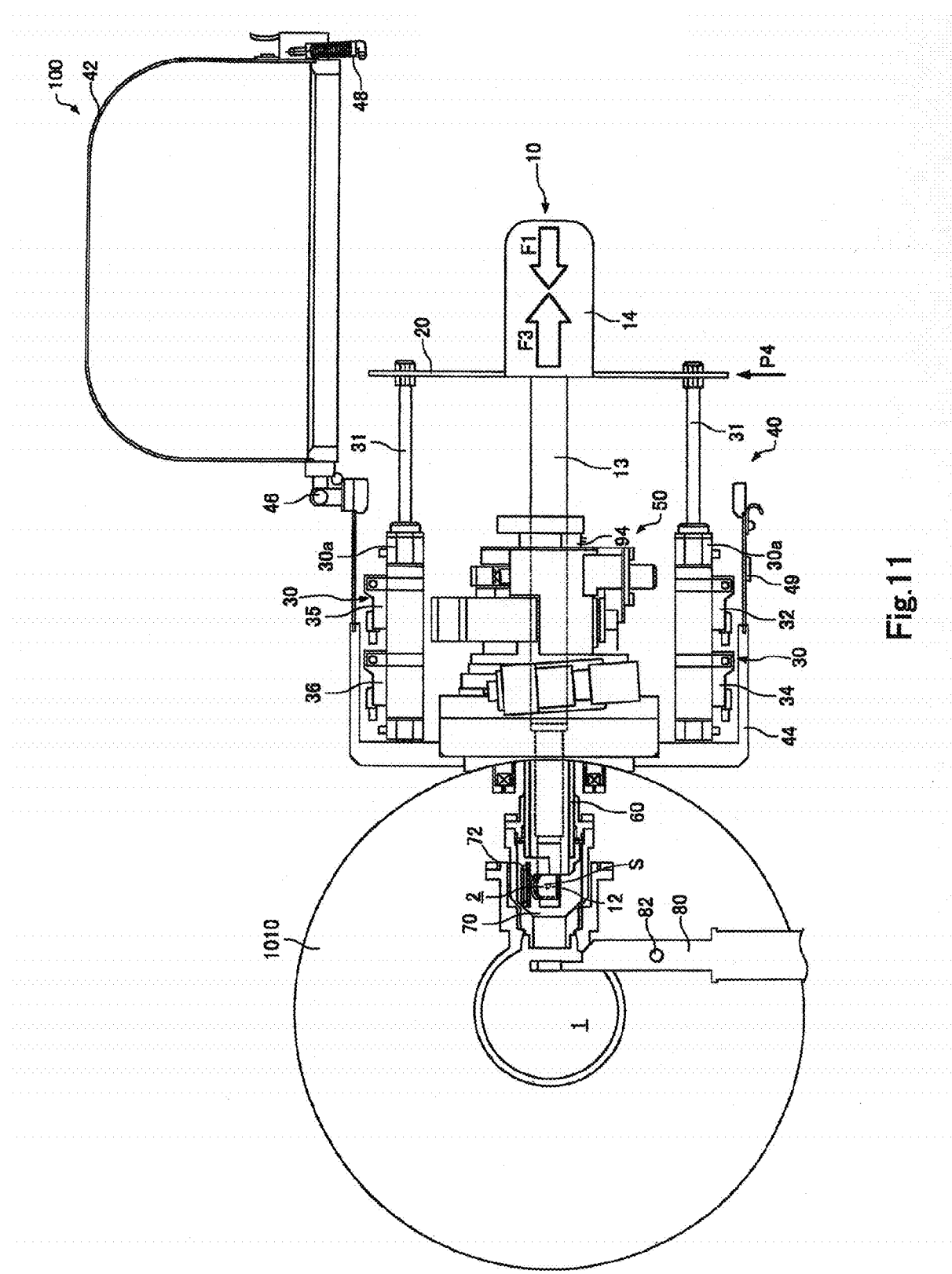

Furthermore, the mechanical drive arrangement 30 moves the support member 20 such that the sample holding portion 12 moves from the sample chamber 1 into the pre-evacuation chamber 2. At this time, the mechanical drive arrangement 30 applies a force F3, which is opposite in sense to the force F1 and greater than the force F1, to the sample holder 10 as shown in FIG. 11. Consequently, the sample holder 10 can be prevented from being violently pulled into the sample chamber 1. The sample holding portion 12 can be moved from the sample chamber 1 into the pre-evacuation chamber 2 by moving the sample holder 10 at a desired speed.

The air cylinders 30a have sensors 32, 34, 35, and 36, respectively, for detecting the position of the support position 20.

The sensor 32 is used to detect whether the support member 20 is at the position P2 (FIG. 8) where the sample holder 10 is supported. When the rod 31 becomes so long that the support member 20 is brought into the position P2, for example, the sensor 32 generates a detection signal.

Figure 7:
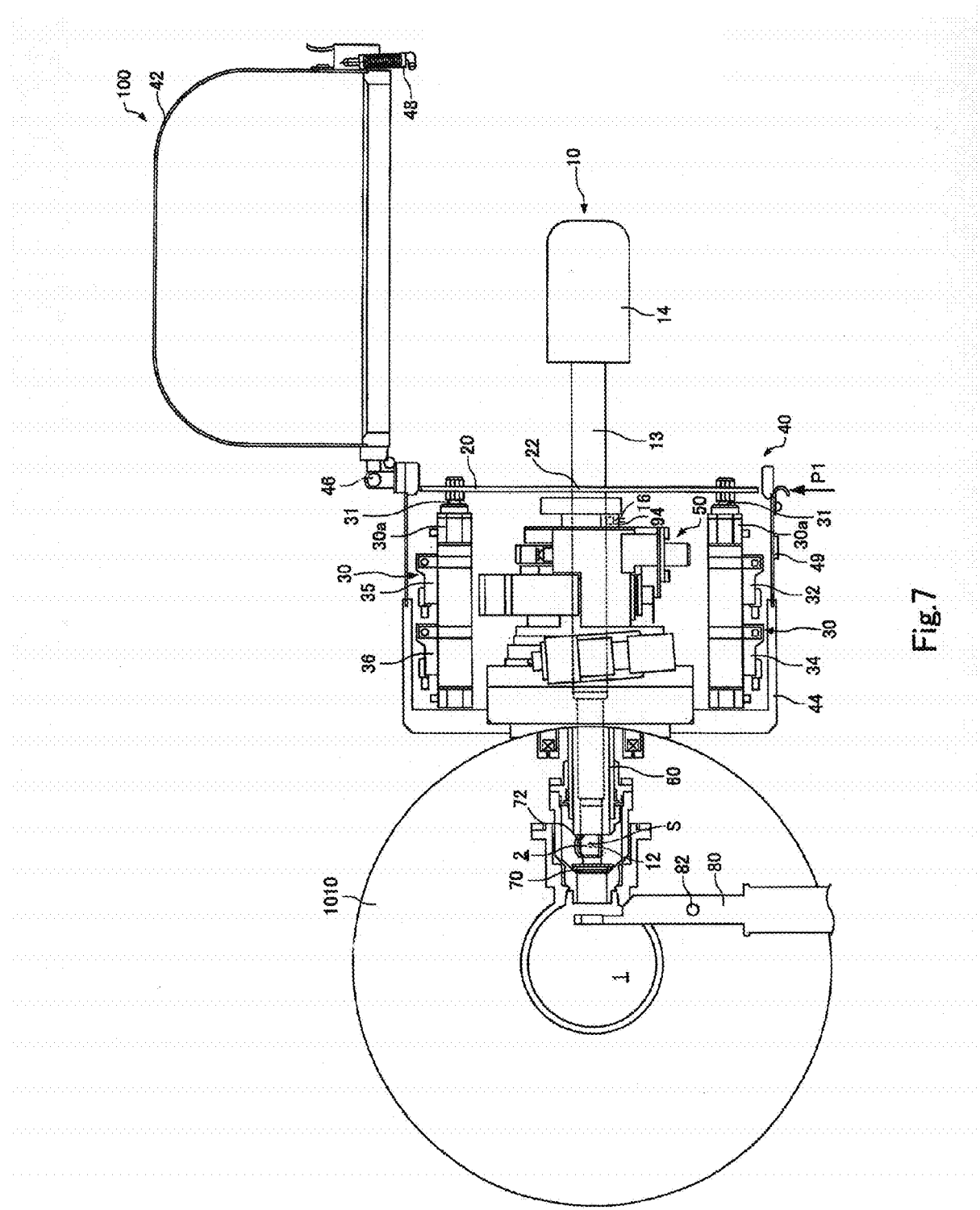
FIGS. 7-11 are schematic views illustrating the operation of the sample introduction device shown in FIGS. 1 and 2.

The sensor 34 is used to detect whether the support member 20 is at its initial position P1 (FIG. 7). When the rod 31 becomes so long that the support member 20 is brought into the first position P1, for example, the sensor 34 generates a detection signal.

The sensor 35 is used to detect whether the sample holding portion 12 is at the position P4 (FIG. 9) where the sample holding portion 12 is introduced into the sample chamber 1. When the rod 31 becomes so long that the support member 20 is brought into the position P4, for example, the sensor 35 generates a detection signal.

The sensor 36 is used to detect whether the support member 20 is at the position P3 (FIG. 10) where a pin 16 of the sample holder 10 moves into a groove in the sample holder insertion tube 60. When the rod 31 becomes so long that the support member 20 is brought into the position P3, for example, the sensor 36 generates a detection signal.

The range of motion of the support member 20 including the positions P1, P2, P3, and P4 can be set by adjusting the detection positions of the sensors 32, 34, 35, and 36.

The goniometer 50 can rotate or tilt the sample holder 10 when the holder is inserted in the sample holder insertion tube 60. When the sample holder 10 is rotated or tilted in this way, the sample holding portion 12 rotates or tilts and thus the sample S can be tilted relative to the electron beam EB. The operation of the goniometer 50 is under control of the controller 90 (FIG. 1). The angular position of the goniometer 50 is detected by a potentiometer (not shown). Alternatively, the angular position of the goniometer 50 may be detected by a detector capable of detecting rotations such as an encoder.

The goniometer 50 has a pre-evacuation feasibility/infeasibility decision sensor 94 that is used to make a decision as to whether pre-evacuation can be done. If the pin 16 (FIG. 3) protruding from the sample holder 10 pushes against the sensor 94, this sensor 94 determines that pre-evacuation is possible.

The gonio cover 40 is a container accommodating the sample holder 10, support member 20, mechanical drive arrangement 30, and goniometer 50. The gonio cover 40 is composed of a cover portion 42 and a housing 44. The cover portion 42 is mounted such that it can be opened and closed. The cover portion 42 has an opening/closing detecting sensor 46 for detecting opening and closing of the cover portion 42. A hook assembly 48 is mounted between the cover portion 42 and the housing 44 to securely hold the cover portion 42 when it is closed. The gonio cover 40 has the sample holder exchange switch 49 for starting operation of the controller 90.

The controller 90 controls the mechanical drive arrangement 30 and goniometer 50 to move the sample holding portion 12 of the sample holder 10 from the pre-evacuation chamber 2 into the sample chamber 1, thus introducing a sample. Furthermore, the controller 90 controls the mechanical drive arrangement 30 and goniometer 50 to move the sample holding portion 12 of the sample holder 10 from the sample chamber 1 into the pre-evacuation chamber 2, thus taking out the sample.

During the process for introducing the sample, the controller 90 performs a first operation for controlling the mechanical drive arrangement 30 to move the support member 20 such that the support member 20 supports the sample holder 10 when its sample holding portion 12 is in the pre-evacuation chamber 2 and to bring the support member 20 to a halt, a second operation for making a decision as to whether the sample holding portion 12 can be moved into the sample chamber 1 on the basis of the position at which the support member 20 is halted, and a third operation for moving the support member 20 providing support of the sample holder 10 such that the sample holding portion 12 is moved from the pre-evacuation chamber 2 into the sample chamber 1 if the decision is that the sample holding portion 12 can be moved into the sample chamber 1.

During the first operation, the controller 90 controls the mechanical drive arrangement 30 to move the support member 20 from its initial position P1 (FIG. 7) and to halt the support member 20 in response to the pressure inside the air cylinders 30a. In particular, when the pressure inside the first pressure chamber 308a exceeds a given value, the controller 90 halts the motion of the support member 20. Consequently, the sample holder 10 can be supported by the support member 20.

The controller 90 performs the second operation for making a decision as to whether the sample holding portion 12 can be moved into the sample chamber 1 on the basis of the position at which the support member 20 is halted as described previously.

Sample holder for charged particle beam instruments comes in various types. Sample holders with different lengths and shapes are available. In the sample introduction device 100, if a sample holder having an inappropriate length or shape is introduced into the sample chamber 1, the goniometer 50 and the polepieces forming the objective lens 1004 may be destroyed. Therefore, in the sample introduction device 100, during the second operation, the controller 90 makes a decision as to whether the sample holder can be introduced into the sample chamber 1, i.e., whether the sample holding portion 12 can be moved into the sample chamber 1.

In particular, during the second operation, if the support member 20 is halted in the given position P2 as a result of the first operation, the controller 90 determines that the sample holding portion 12 can be moved into the sample chamber 1. On the other hand, if the support member 20 is not halted at the position P2, the controller 90 determines that the sample holding portion 12 cannot be moved into the sample chamber 1.

The position P2 is set to the position of the cutouts 15 in the sample holder 10 of appropriate length and shape when the sample holding portion 12 is in the pre-evacuation chamber 2. That is, during the first operation, when the sample holding portion 12 of the holder 10 is in the pre-evacuation chamber 2, the sample holder 10 is supported by the support member 20 at this position P2. During the first operation, the fitting portions 24 of the support member 20 are brought into fitting engagement with the cutouts 15 in the sample holder 10 at the position P2. The position P2 is set according to the position of the sensor 32.

For example, when the support member 20 is halted, if the output signal from the sensor 32 is applied, the controller 90 determines that the sample holding portion 12 can be moved into the sample chamber 1. On the other hand, when the support member 20 is halted, if the output signal from the sensor 32 is not applied, the controller 90 determines that the sample holding portion 12 cannot be moved into the sample chamber 1.

In the third operation, if the decision is that the sample holding portion 12 can be moved into the sample chamber 1, the controller 90 moves the support member 20 supporting the sample holder 10 to move the sample holding portion 12 from the pre-evacuation chamber 2 into the sample chamber 1.

On the other hand, if the decision is that the sample holding portion 12 cannot be moved into the sample chamber 1, the controller 90 does not perform the operation for moving the support member 20 supporting the sample holder 10 and thus the sample holding portion 12 is not moved from the pre-evacuation chamber 2 into the sample chamber 1. For example, if the decision is that the sample holding portion 12 cannot be moved into the sample chamber 1, the controller 90 operates to move the support member 20 to its initial position P1 without supporting the sample holder 10.

The controller 90 can perform an operation for controlling the mechanical drive arrangement 30 in response to the output signals from the sensors 32, 34, 35, and 36 to move or stop the support member 20.

The functions of the controller 90 can be implemented by hardware (such as various processors (e.g., a CPU or a DSP) or an ASIC (e.g., a gate array)) or software.

2. Operation of Sample Introduction Device

The operation of the sample introduction device 100 associated with the present embodiment is next described by referring to FIGS. 7-11.

(1) Procedure for Introducing Sample Holder into Sample Chamber

The operation of the sample introduction device 100 performed when the sample holder 10 is introduced into the sample chamber 1 is first described.

As shown in FIG. 7, if the user opens the cover portion 42, the opening/closing detecting sensor 46 is turned ON, activating the pre-evacuation feasibility/infeasibility decision sensor 94. The user inserts the sample holder 10 into the through-hole 22 in the support member 20 and into the sample holder insertion tube 60, and the sample holder 10 (i.e., the sample holding portion 12) is introduced into the pre-evacuation chamber 2. At this time, the goniometer 50 has rotated through 90 degrees to the right. The sample holder 10 is inserted into the sample holder insertion tube 60 while assuming a position of 0 degree.

When the sample holder 10 is inserted into the sample holder insertion tube 60 and the sample holding portion 12 is introduced into the pre-evacuation chamber 2, the pin 16 protruding from the sample holder 10 pushes against the pre-evacuation feasibility/infeasibility decision sensor 94 as shown in FIG. 7, thus turning ON the sensor 94. The user pushes the sample holder exchange switch 49 to start pre-evacuation in the pre-evacuation chamber 2. At the same time, the controller 90 starts a procedure for introducing a sample as described below. At this time, the support member 20 is in its initial position P1 as shown in FIG. 7.

Figure 12:
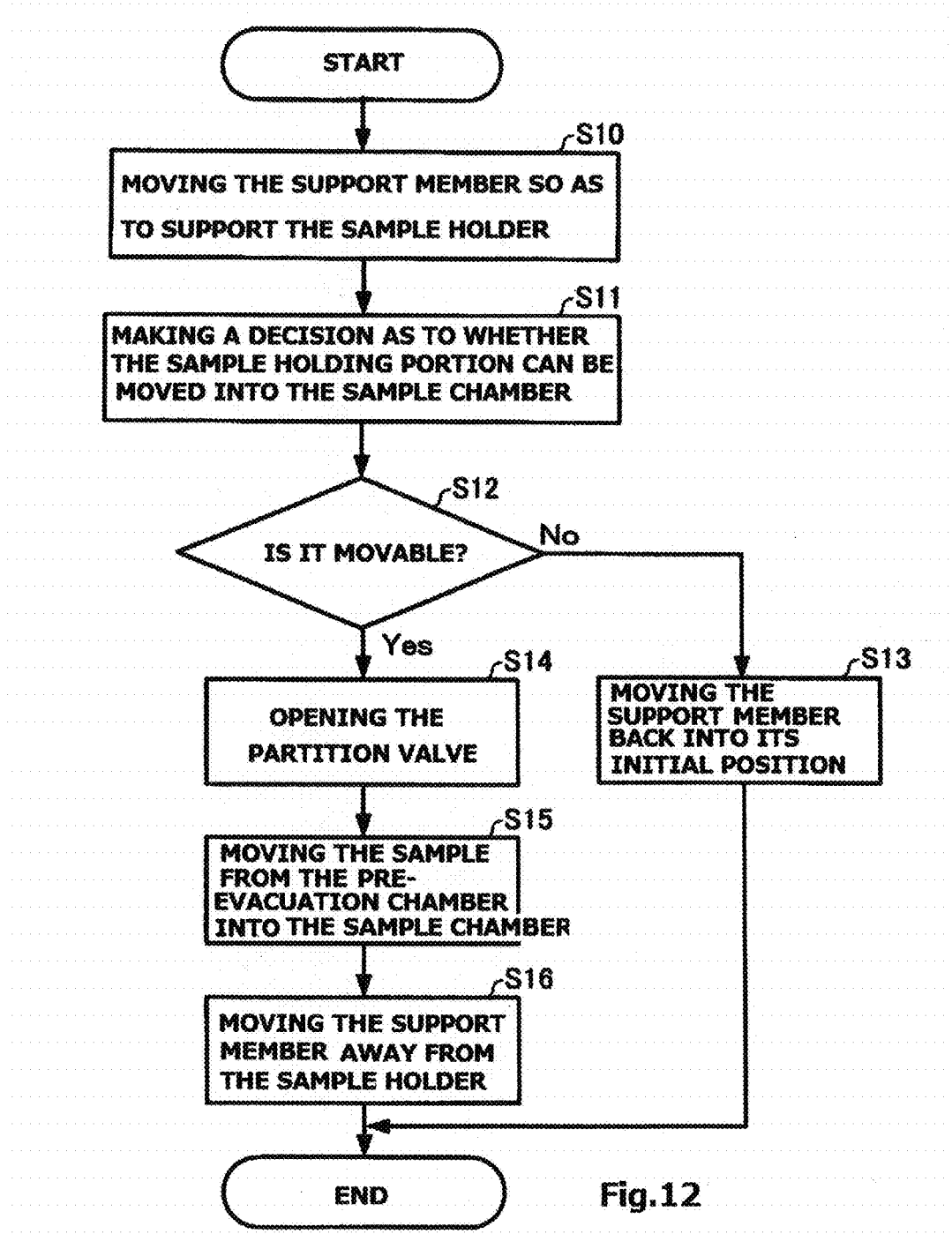
FIG. 12 is a flowchart illustrating one example of subroutine performed by a controller of the sample introduction device shown in FIG. 2.

FIG. 12 is a flowchart illustrating one example of the subroutine performed by the controller 90 of the sample introduction device 100 when the sample holder 10 is introduced into the sample chamber 1. Processing steps S10-S16 performed by the controller 90 as described below are implemented, for example, as an automatic sequence.

Figure 8:
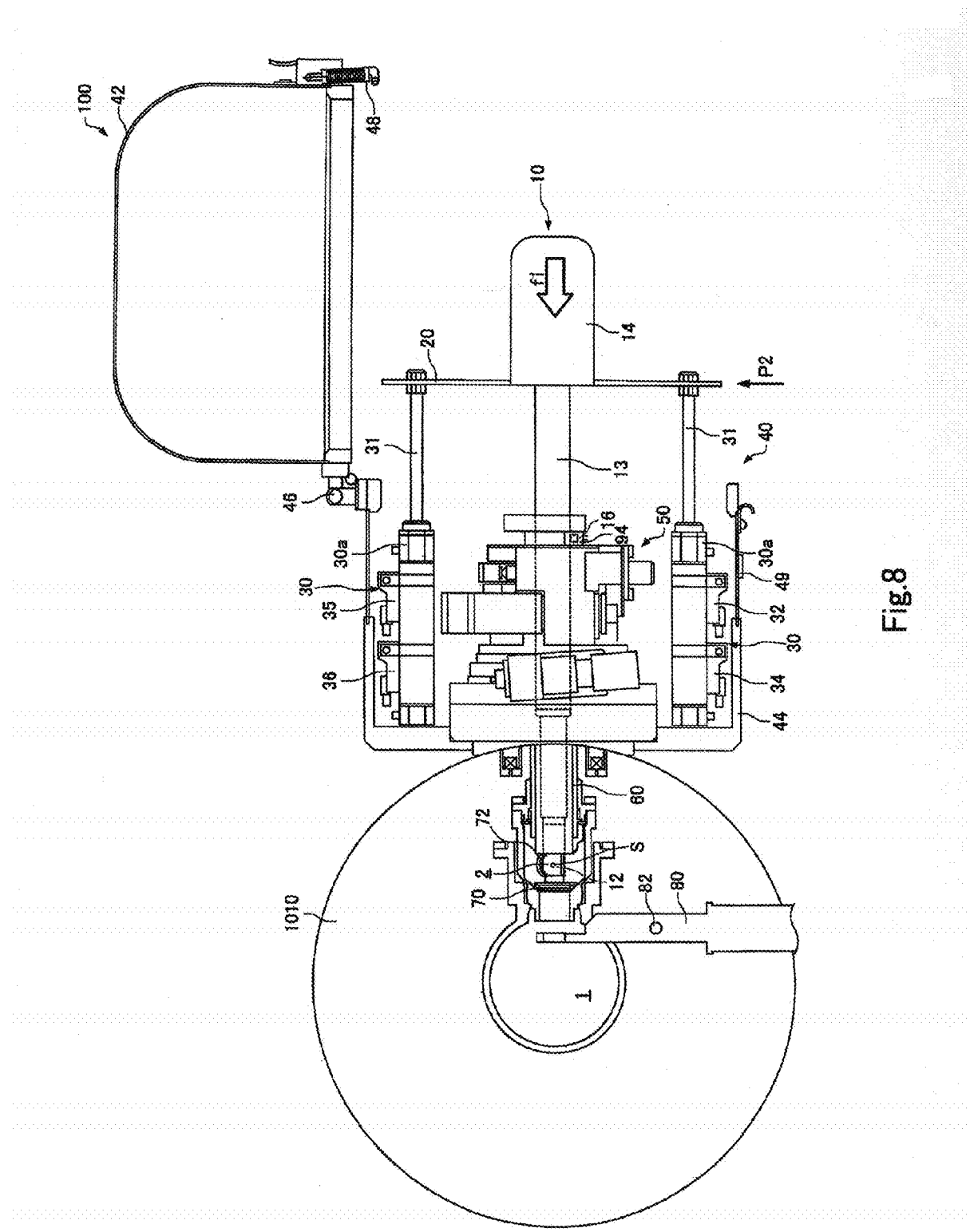

First, the controller 90 controls the mechanical drive arrangement 30 to move the support member 20 so as to support the sample holder 10 (step S10). Consequently, as shown in FIG. 8, the rods 31 stretch, moving the support member 20 from its initial position P1 toward the position P2.

If the pressure inside the first pressure chamber 308a (FIG. 6) reaches a given value, the controller 90 brings the support member 20 to a halt. Accordingly, if the support member 20 touches and supports the sample holder 10, the pressure inside the first pressure chamber 308a of the air cylinder 30a rises and reaches the given value. The controller 90 brings the support member 20 to a halt.

At this time, the fitting portions 24 (FIG. 5) of the support member 20 remain fitted in the cutouts 15 in the sample holder 10. This suppresses rotation about the axis of the sample holder 10. The pressure difference between the pre-evacuation chamber 2 and the outside (atmospheric pressure) applies the force F1 to the sample holder 10, urging the holder into the pre-evacuation chamber 2.

Then, the controller 90 makes a decision as to whether the sample holding portion 12 can be moved into the sample chamber 1 on the basis of the position at which the support member 20 is halted (step S11).

If the support member 20 has halted in the given position P2, the controller 90 determines that the sample holding portion 12 can be moved into the sample chamber 1. On the other hand, if the support member 20 has not halted at the position P2, the controller 90 determines that the sample holding portion 12 cannot be moved into the sample chamber 1.

If the decision at step S12 is NO, indicating that the sample holding portion 12 cannot be moved into the sample chamber 1, the controller 90 controls the mechanical drive arrangement 30, moving the support member 20 back into its initial position P1 (step S13). Consequently, as illustrated in FIG. 7, the support member 20 returns to its initial position P1. The subroutine is terminated without moving the sample holding portion 12 into the sample chamber 1.

Figure 9:
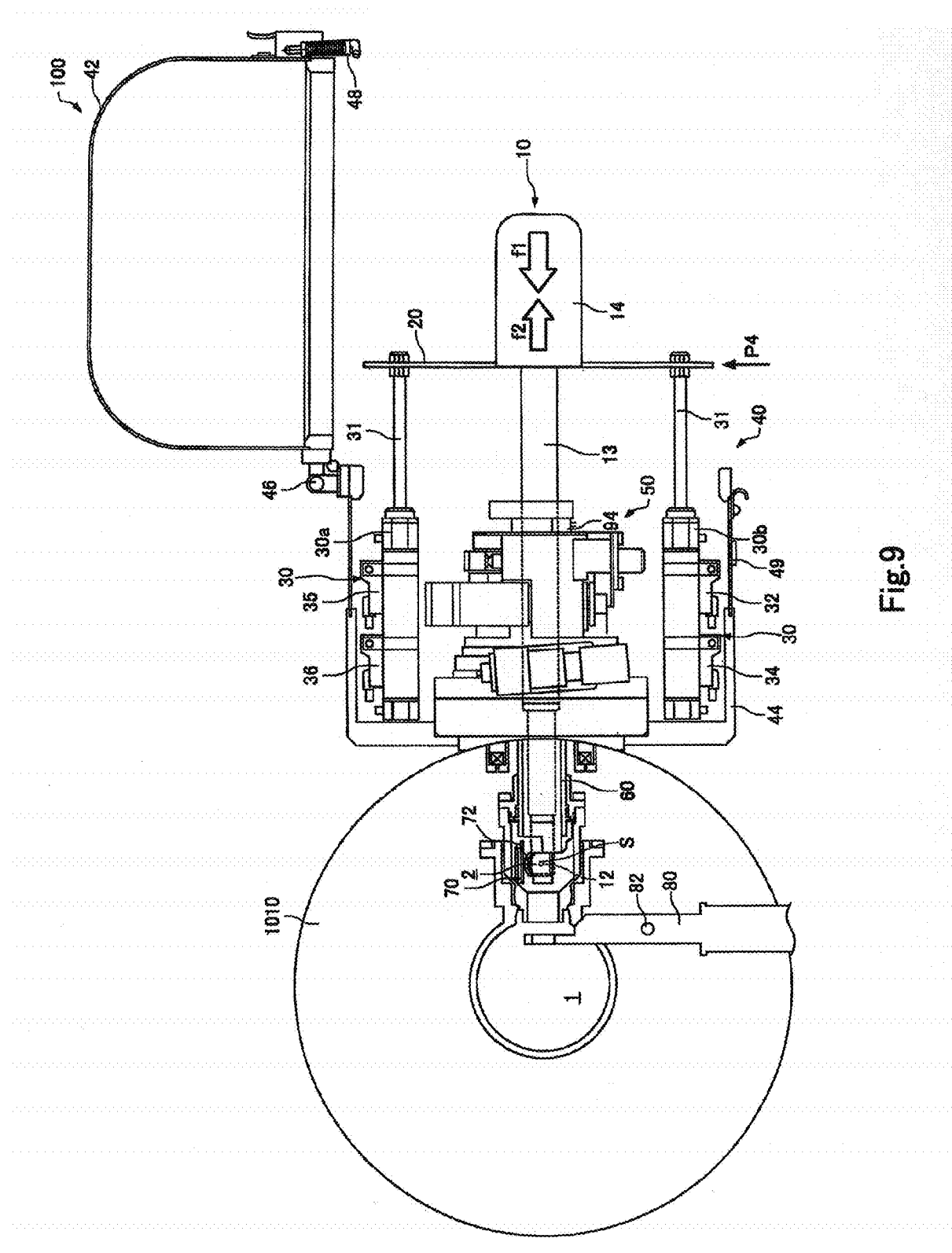

On the other hand, if the decision at step S12 is YES, indicating that the sample holding portion 12 can be moved into the sample chamber 1, the controller 90 rotates the goniometer 50 to open the partition valve 70 that isolates the sample chamber 1 and the pre-evacuation chamber 2 from each other as shown in FIG. 9 (step S14).

In particular, the controller 90 first rotates the goniometer 50 through 25 degrees to the left. Then, the controller 90 controls the mechanical drive arrangement 30 to move the support member 20 from the position P2 to the position P4. The sensor 35 is adjusted to the position P4. The controller 90 moves the support member 20 to the position P4 in response to the output signal from the sensor 35.

Consequently, the pin 16 of the sample holder 10 moves into the groove in the sample holder insertion tube 60, bringing the sample holder 10 and the sample holder insertion tube 60 together. This restricts rotation of the sample holder insertion tube 60.

Then, the controller 90 controls the goniometer 50 to rotate the goniometer 50 through 65 degrees to the left. At this time, rotation of the sample holder insertion tube 60 is restricted and so the gear 72 varies its angular positional relationship with the sample holder insertion tube 60 as the goniometer 50 rotates. This rotates the gear 72, opening the partition valve 70. As a result, the pre-evacuation chamber 2 and the sample chamber 1 are placed in communication with each other. Under this condition, the force F1 is applied to the sample holder 10 owing to the pressure difference between the sample chamber 1 and the outside (atmospheric pressure), thus urging the holder 10 into the sample chamber 1.

Figure 10:
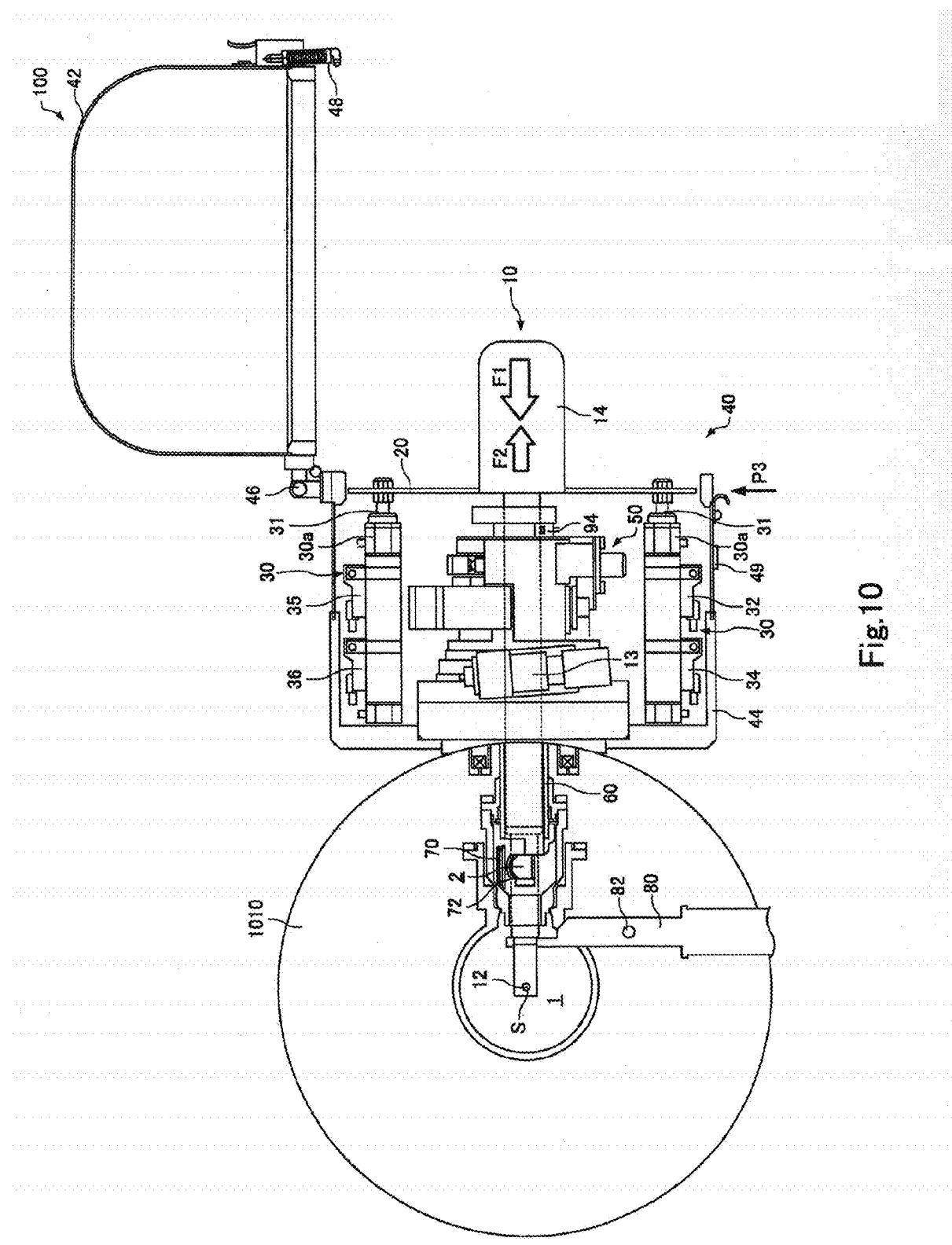

Then, the controller 90 controls the mechanical drive arrangement 30 to move the support member 20 such that the sample holding portion 12 is moved from the pre-evacuation chamber 2 into the sample chamber 1 as shown in FIG. 10 (step S15).

The sensor 36 is adjusted to the position P3. The controller 90 moves the mechanical drive arrangement 30 into the position P3 in response to the output signal from the sensor 36. The mechanical drive arrangement 30 exerts the force F2, which is opposite in sense to the force F1 and smaller than the force F1, on the sample holder 10. Consequently, the rods 31 contract, moving the support member 20 from the position P4 (FIG. 9) into the position P3. The sample holding portion 12 is moved from the pre-evacuation chamber 2 into the sample chamber 1. In the example of FIG. 10, the support member 20 is moved until the sample holder 10 strikes the lever 80.

Then, the controller 90 controls the mechanical drive arrangement 30 to move the support member 20 away from the sample holder 10 as shown in FIG. 2 (step S16). The sensor 34 is adjusted to the initial position P1. The controller 90 moves the mechanical drive arrangement 30 into the initial position P1 in response to the output signal from the sensor 34. Consequently, the rods 31 contract further. The support member 20 is separated from the sample holder 10 and returns to its initial position P1.

As shown in FIG. 2, since the support member 20 is separated from the sample holder 10, the sample holder 10 is allowed to be moved by the lever 80 and rotated or tilted by the goniometer 50. After this step S16, the controller 90 terminates the subroutine. The user closes the cover portion 42 of the gonio cover 40.

Because of the processing steps described so far, the sample holder 10 can be inserted into the sample chamber 1, i.e., the sample S can be introduced into the sample chamber 1.

If a preset time has passed during the processing of the steps S10, S13, S14, S15, and S16, the controller 90 interrupts the processing. This assures that the sample S can be introduced into the sample chamber 1 safely.

(2) Procedure for Taking Out Sample Holder from Sample Chamber

The operation of the sample introduction device 100 performed when the sample holder 10 is taken out from the sample chamber 1 is next described.

When the sample holder 10 shown in FIG. 2 is inserted in the sample chamber 1, the user opens the cover portion 42 and presses the sample holder exchange switch 49. This causes the controller 90 to start a procedure for taking out a sample as described below.

Figure 13:
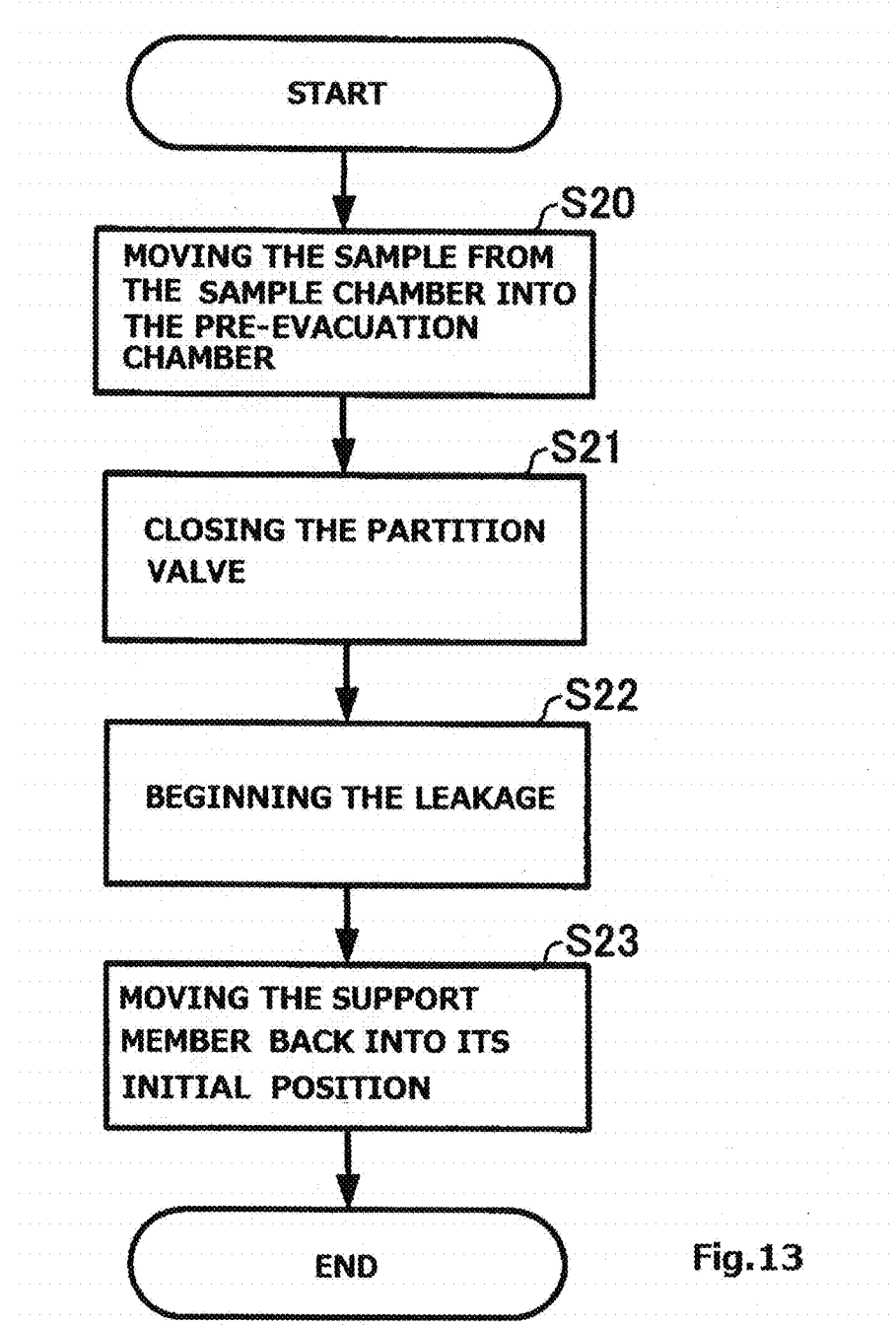
FIG. 13 is a flowchart illustrating another example of subroutine performed by the controller of the sample introduction device shown in FIG. 2.

FIG. 13 is a flowchart illustrating one example of the subroutine performed by the controller 90 of the sample introduction device 100 when the sample holder 10 is taken out from the sample chamber 1. Processing steps S20, S21, S22, and S23 of the controller 90 illustrated below are implemented, for example, as an automatic sequence.

The controller 90 controls the mechanical drive arrangement 30 to move the support member 20 such that the sample holding portion 12 moves from the sample chamber 1 into the pre-evacuation chamber 2 as shown in FIG. 11 (step S20).

At this time, the mechanical drive arrangement 30 applies the force F3, which is opposite in sense to the force F1 applied to the sample holder 10 by the pressure difference between the sample chamber 1 and the outside (atmospheric pressure) and is greater than the force F1, to the sample holder 10. The sensor 35 is adjusted for the position P4. The controller 90 moves the support member 20 into the position P4 in response to the output signal from the sensor 35. This stretches the rods 31, moving the support member 20 from its initial position P1 (FIG. 2) into the position P4. Consequently, the sample holding portion 12 is moved from the sample chamber 1 into the pre-evacuation chamber 2.

Then, the controller 90 rotates the goniometer 50 to close the partition valve 70 that isolates the sample chamber 1 and the pre-evacuation chamber 2 from each other as shown in FIG. 9 (step S21).

Specifically, the controller 90 first causes the goniometer 50 to rotate through 65 degrees to the right. This closes the partition valve 70, thus isolating the sample chamber 1 and the pre-evacuation chamber 2 from each other. The controller 90 then controls the mechanical drive arrangement 30 to move the support member 20 from the position P4 into the position P2. Further, the controller causes the goniometer 50 to rotate through 25 degrees to the right. At this time, the pin 16 of the sample holder 10 pushes the pre-evacuation feasibility/infeasibility decision sensor 94, thus turning ON the sensor 94. This commences leakage from the pre-evacuation chamber 2 (step S22). This leakage is carried out, for example, by supplying an inert gas such as nitrogen gas into the pre-evacuation chamber 2.

After completion of the leakage, the user can pull out the sample holder 10. At this time, the pin 16 of the sample holder 10 turns OFF the pre-evacuation feasibility/infeasibility decision sensor 94. The controller 90 controls the mechanical drive arrangement 30 to move the support member 20 back into its initial position P1 in an unillustrated manner (step S23). More specifically, the sensor 34 is adjusted for the initial position P1 of the support member. The controller 90 moves the support member 20 into its initial position P1 in response to the output signal from the sensor 34. After this step S23, the controller 90 terminates the subroutine.

Because of the processing steps described so far, the sample holder 10 can be taken out from the sample chamber 1. That is, the sample S can be taken out from the sample chamber 1.

If a preset time has passed during the processing of steps S20, S21, S22, and S23, the controller 90 interrupts the subroutine. Furthermore, if a large increase or decrease occurs in the flow rate of air supplied into the air cylinders 30a, the controller 90 interrupts the subroutine. This ensures that the sample S can be taken out of the sample chamber 1 safely.

In the description provided so far, the controller 90 performs an automatic sequence for moving the sample holding portion 12 from the sample chamber 1 into the pre-evacuation chamber 2 and vice versa. In the sample introduction device 100, the sample holding portion 12 can be moved manually from the pre-evacuation chamber 2 into the sample chamber 1 and vice versa by moving the sample holder 10 by the user without performing an automatic sequence.

The sample introduction device 100 and charged particle beam instrument 1000 associated with the present embodiment have the following features.

In the sample introduction device 100, the controller 90 performs the first operation for controlling the mechanical drive arrangement 30 to move the support member 20 such that the support member 20 supports the sample holder 10 when its sample holding portion 12 is in the pre-evacuation chamber 2 and to bring the support member 20 to a halt, the second operation for making a decision as to whether the sample holding portion 12 can be moved into the sample chamber 1 on the basis of the position at which the support member 20 is halted, and the third operation for moving the support member 20 providing support of the sample holder 10 such that the sample holding portion 12 moves from the pre-evacuation chamber 2 into the sample chamber 1 if the decision is that the sample holding portion 12 can be moved into the sample chamber 1. This can prevent a sample holder of an inappropriate length from being introduced into the sample chamber 1. Otherwise, the goniometer 50 and the polepieces forming the objective lens 1004 would be destroyed or damaged.

Furthermore, the sample introduction device 100 is configured including the mechanical drive arrangement 30 for moving the support member 20 providing support of the sample holder 10 such that the sample holding portion 12 (and the sample S) moves from the pre-evacuation chamber 2 into the sample chamber 1. Therefore, the sample S can be easily introduced into the sample chamber 1.

In the sample introduction device 100, the controller 90 determines, during the second operation, that the sample holding portion 12 can be moved into the sample chamber 1 if the support member 20 halts in the given position in the first operation. If the support member 20 has not halted in the given position in the first operation, the controller determines that the sample holding portion 12 cannot be moved into the sample chamber 1. This can prevent a sample holder of an inappropriate length from being introduced into the sample chamber 1.

In the sample introduction device 100, the sample holder 10 has the cutouts 15. The support member 20 has the fitting portions 24 which are brought into fitting engagement with the cutouts 15 when the sample holder 10 is supported. Consequently, the position P2 (FIG. 8) at which the support member 20 supports the sample holder 10 can be made different than in the case where the sample holder 10 does not have the cutouts 15. Where the sample holder 10 does not have the cutouts 15, the support member 20 supports the sample holder 10 at a position located a distance ahead of the position P2 shown in FIG. 8, the distance corresponding to the depth of the cutouts 15. This can certainly prevent a sample holder not having the cutouts 15 and having an inappropriate length or shape from being erroneously introduced into the sample chamber 1.

In the sample introduction device 100, the sample holder 10 has two cutouts 15 which are arranged symmetrically with respect to the axis of the sample holder 10. The support member 20 has two fitting portions 24 which are disposed symmetrically with respect to the center of the through-hole 22. Consequently, the support member 20 can allow for balanced support of the sample holder 10.

In the sample introduction device 100, the mechanical drive arrangement 30 has the air cylinders 30a connected to the support member 20. The controller 90 stops the support member 20 in response to the pressure inside the air cylinders 30a. Consequently, the controller 90 can support the sample holder 10 to the support member 20.

In the sample introduction device 100, during the third operation, the mechanical drive arrangement 30 applies the second force F2, which is opposite in sense to the force F1 applied to the sample holder 10 by the pressure difference between the sample chamber 1 and the outside (atmospheric pressure) and is smaller than the first force F1, to the sample holder 10. Consequently, it is possible to prevent the sample holder 10 from being violently drawn into the sample chamber 1 due the first force F1 applied to the sample holder 10 by the pressure difference between the sample chamber 1 and the outside (atmospheric pressure).

The sample introduction device 100 includes the goniometer 50 for rotating the sample holder 10 and the partition valve 70 that isolates the pre-evacuation chamber 2 and the sample chamber 1 from each other. Furthermore, the controller 90 operates to rotate the goniometer 50 to open the partition valve 70. Consequently, the partition valve 70 isolating the pre-evacuation chamber 2 and the sample chamber 1 from each other can be opened. Hence, the sample introduction device 100 permits the sample S to be introduced into the sample chamber 1 easily.

In the sample introduction device 100, the mechanical drive arrangement 30 moves the support member 20 such that the sample holding portion 12 moves from the sample chamber 1 into the pre-evacuation chamber 2. Therefore, the sample S can be easily moved from the sample chamber 1 into the pre-evacuation chamber 2. Thus, the sample introduction device 100 permits the sample S to be taken out of the sample chamber 1 easily.

Since the charged particle beam instrument 1000 is configured including the sample introduction device 100, the sample S can be easily introduced into the sample chamber 1 as described previously. Furthermore, if the sample S is attempted to be introduced into the sample chamber 1 using a sample holder of an inappropriate length or shape, destruction of the goniometer 50 and polepieces forming the objective lens 1004 can be prevented.

3. Modifications

Modifications of the sample introduction device 100 associated with the present embodiment are next described. Note that only differences with the above-described example of sample introduction device 100 are described; a description of similarities is omitted.

(1) First Modification

A first modification is first described. The controller 90 of the above-described sample introduction device 100 stops the support member 20 in response to the pressure inside any of the air cylinders 30a (such as the first pressure chamber 308a). The support member 20 may be stopped in response to the flow rate of gas in the air cylinder 30a.

Specifically, if the flow rate of compressed air expelled from the second port 306 of the air cylinder 30a shown in FIG. 5 has decreased below a given flow rate, the controller 90 assumes that the support member 20 has supported the sample holder 10 and stops the support member 20. At this time, the piston 303 comes to a halt, and the flow rate of compressed air discharged from the second pressure chamber 308b decreases to a low level or zero. Therefore, the controller 90 can assume that the support member 20 has supported the sample holder 10. Consequently, the controller 90 can cause the support member 20 to support the sample holder 10.

(2) Second Modification

A second modification is next described. In the above-described sample introduction device 100, the controller 90 brings the support member 20 to a halt in response to the pressure inside any of the air cylinders 30a such as the first pressure chamber 308a. Alternatively, the support member 20 may be brought to a halt in response to the operation of a sensor that monitors the position of the support member 20.

Furthermore, the support member 20 may be brought to a halt using a sensor that produces an output signal when the sample holder 10 and the support member 20 come into contact with each other.

(3) Third Modification

A third modification is next described. In the description of the above-described example of sample introduction device 100, the mechanical drive arrangement 30 is configured including the air cylinders 30a as shown in FIG. 2. The mechanical drive arrangement 30 is not restricted to this configuration. For example, the mechanical drive arrangement may be configured including an electric actuator that operates the rods 31.

(4) Fourth Modification

A fourth modification is next described. In the above example of the sample introduction device 100, the mechanical drive arrangement 30 is received inside the gonio cover 40 as shown in FIG. 2. Alternatively, the mechanical drive arrangement 30 may be disposed outside the gonio cover 40.

(5) Fifth Modification

A fifth modification is next described. In the description of the above-described embodiment, the sample introduction device 100 is applied to a transmission electron microscope. The sample introduction device 100 can be applied to other charged particle beam instruments as well as to transmission electron microscopes. Examples of charged particle beam instrument include an electron microscope (such as a scanning electron microscope (SEM) or a scanning transmission electron microscope (STEM)), a focused ion beam (FIB) system, and an electron beam exposure system.

The present invention embraces configurations (e.g., configurations identical in function, method, and results or identical in purpose and advantageous effects) which are substantially identical to the configurations described in connection with the above embodiment. Furthermore, the invention embraces configurations which are similar to the configurations described in connection with the above embodiment except that their nonessential portions have been replaced. Additionally, the invention embraces configurations which are identical in advantageous effects to, or which can achieve the same object as, the configurations described in connection with the above embodiment. Further, the invention embraces configurations which are similar to the configurations described in connection with the above embodiment except that a well-known technique is added.

Having thus described my invention with the detail and particularity required by the Patent Laws, what is desired protected by Letters Patent is set forth in the following claims.

The invention claimed is:

1. A sample introduction device for introducing a sample into a sample chamber of a charged particle beam instrument, said sample introduction device comprising:
   a pre-evacuation chamber for performing pre-evacuation;
   a sample holder having a sample holding portion capable of holding the sample;
   a mechanical drive arrangement for moving the sample holder between the pre-evacuation chamber and the sample chamber; and
   a controller for controlling the mechanical drive arrangement,
   wherein said controller is programmed to perform a first operation for controlling the mechanical drive arrangement to move a support member such that the support member provides support of the sample holder when its sample holding portion is in the pre-evacuation chamber and to bring the support member to a halt, a second operation for making a decision as to whether the sample holding portion can be moved into the sample chamber, based on the position at which the support member is halted, and a third operation for controlling the mechanical drive arrangement to move the support member providing support of the sample holder such that the sample holding portion moves from the pre-evacuation chamber into the sample chamber if the decision is affirmative to indicate that the sample holding portion can be moved into the sample chamber.

2. The sample introduction device as set forth in claim 1, wherein said controller determines that, if said support member is halted in a given position during said first operation, said sample holding portion can be moved into said sample chamber, and wherein the controller determines that, if the support member is not halted in the given position during the first operation, the sample holding portion cannot be moved into the sample chamber.

3. The sample introduction device as set forth in claim 2, wherein said sample holder has at least one cutout, and wherein said support member said has a fitting portion that is fitted into the cutout when the support member provides support of the sample holder.

4. The sample introduction device as set forth in claim 3, wherein said at least one cutout of said sample holder is two in number, and wherein the two cutouts are arranged symmetrically with respect to the axis of the sample holder.

5. The sample introduction device as set forth in claim 2, wherein said mechanical drive arrangement has air cylinders connected to said support member, and wherein said controller brings the support member to a halt in response to the pressure inside the air cylinders during said first operation.

6. The sample introduction device as set forth in claim 2, wherein said mechanical drive arrangement has air cylinders connected to said support member, and wherein said controller brings the support member to a halt in response to the flow rate of gas in the air cylinders during said first operation.

7. The sample introduction device as set forth in claim 2, wherein said mechanical drive arrangement applies a second force, which is opposite in sense to a first force applied to the sample holder by the pressure difference between the sample chamber and the outside and is smaller than the first force, to the sample holder during said third operation.

8. The sample introduction device as set forth in claim 2, further comprising:
   a goniometer for rotating said sample holder; and
   a partition valve for isolating said pre-evacuation chamber and said sample chamber from each other;
   wherein said controller further operates to rotate said goniometer to open said partition valve.

9. The sample introduction device as set forth in claim 2, wherein said mechanical drive arrangement moves said sample holder such that said sample holding portion moves from said sample chamber into said pre-evacuation chamber.

10. A charged particle beam instrument including a sample introduction device as set forth in claim 1.

* * * * *